US010696874B2

(12) United States Patent
Moore et al.

(10) Patent No.: US 10,696,874 B2
(45) Date of Patent: Jun. 30, 2020

(54) ADHESIVE WITH TUNABLE POROSITY AND METHODS TO SUPPORT TEMPORARY BONDING APPLICATIONS

(71) Applicants: John Cleaon Moore, Camarillo, CA (US); Jared Michael Pettit, CAmarillo, CA (US)

(72) Inventors: John Cleaon Moore, Camarillo, CA (US); Jared Michael Pettit, CAmarillo, CA (US)

( * ) Notice: Subject to any disclaimer, the term of this patent is extended or adjusted under 35 U.S.C. 154(b) by 0 days.

(21) Appl. No.: 16/256,471

(22) Filed: Jan. 24, 2019

(65) Prior Publication Data
US 2019/0169471 A1    Jun. 6, 2019

Related U.S. Application Data

(62) Division of application No. 14/772,372, filed as application No. PCT/US2014/020320 on Mar. 4, 2014, now abandoned.
(Continued)

(51) Int. Cl.
*C09J 9/00* (2006.01)
*C09J 11/08* (2006.01)
(Continued)

(52) U.S. Cl.
CPC ............................ *C09J 9/00* (2013.01); *B32B 7/06* (2013.01); *B32B 38/0032* (2013.01);
(Continued)

(58) Field of Classification Search
CPC ....... H01L 21/6835; H01L 2221/68318; H01L 2221/68381; H01L 24/98; B32B 7/06;
(Continued)

(56) References Cited

U.S. PATENT DOCUMENTS

| 4,556,439 A | * | 12/1985 | Bannink, Jr. | ......... B29C 65/601 156/92 |
| 2003/0070747 A1 | * | 4/2003 | Kydd | ..................... H05K 3/207 156/233 |

(Continued)

*Primary Examiner* — Philip C Tucker
*Assistant Examiner* — Jimmy R Smith, Jr.
(74) *Attorney, Agent, or Firm* — Andrew Auerbach

(57) ABSTRACT

Methods and compositions are described for a temporary adhesive used to affix a work unit onto a carrier substrate whereby its porosity is tuned by choosing and adjusting the polymeric resin and filler components to provide sufficient adhesion to support a manufacturing process, and upon completion, there is advanced penetration of a liquid into the interfacial bond causing release of the work unit without harm. The temporary adhesive provides a tunable porosity that is dependent upon the mathematical calculation of the weight basis ratio of filler to binder, that is preferably greater than 1.0, more preferably greater than 2.0, and most preferably greater than 3.0. The temporary adhesive may be applied and cured in a variety of ways that meet the needs of the form of the work unit and objectives of the manufacturing process. The invention provides benefits of flexibility and reduced cost when establishing practices to handle difficult work units in the manufacture of semiconductors and flat panel displays.

8 Claims, 1 Drawing Sheet

Related U.S. Application Data

(60) Provisional application No. 61/773,766, filed on Mar. 6, 2013.

(51) Int. Cl.

| | |
|---|---|
| *C09J 11/04* | (2006.01) |
| *H01L 23/00* | (2006.01) |
| *H01L 21/683* | (2006.01) |
| *B32B 7/06* | (2019.01) |
| *B32B 38/10* | (2006.01) |
| *B32B 38/00* | (2006.01) |
| *C09J 5/00* | (2006.01) |
| *C08K 3/013* | (2018.01) |

(52) U.S. Cl.
CPC ............... *B32B 38/10* (2013.01); *C09J 5/00* (2013.01); *C09J 11/04* (2013.01); *C09J 11/08* (2013.01); *H01L 21/6835* (2013.01); *H01L 24/27* (2013.01); *H01L 24/98* (2013.01); *C08K 3/013* (2018.01); *C09J 2205/302* (2013.01); *H01L 2221/68318* (2013.01); *H01L 2221/68381* (2013.01)

(58) Field of Classification Search
CPC ..... B32B 38/10; B32B 38/0032; C08K 3/013; C09J 11/04; C09J 11/08; C09J 9/00; C09J 2205/302
USPC ........................................................ 156/247
See application file for complete search history.

(56) References Cited

U.S. PATENT DOCUMENTS

| | | | |
|---|---|---|---|
| 2004/0231793 A1* | 11/2004 | Kroninger | B23Q 3/084 156/344 |
| 2016/0017184 A1* | 1/2016 | Moore | C09J 9/00 156/247 |

* cited by examiner

ADHESIVE WITH TUNABLE POROSITY AND METHODS TO SUPPORT TEMPORARY BONDING APPLICATIONS

CROSS-REFERENCE TO RELATED APPLICATION

This application claims the benefit of U.S. Provisional Application No. 61/773,766, filed Mar. 6, 2013, PCT/US14/20320 filed Mar. 4, 2014 and a divisional of U.S. application Ser. No. 14/772,372 filed Sep. 2, 2015.

FIELD OF THE INVENTION

The present invention relates generally to a porous adhesive that is used to affix a work unit to hard and rigid carrier substrate and sufficiently holds the work unit in place to support several manufacturing steps whereby they are subsequently released within a short time period by liquid penetration without observable harm to the integrity of the work unit or carrier substrate. In particular, the porous adhesive comprises an adjustable mixture of binder and filler chemistry to affix a work unit to a carrier substrate such that it satisfies the physical, thermal, and chemical effects of a manufacturing process and subsequently allows easy and fast separation of the respective substrates by liquid capillary penetration without observable damage. The value and importance of a tunable adhesive for temporary bonding applications is recognized in the manufacture of thin electronic devices such as displays or semiconductors, where the work unit may vary widely in thickness, flexibility, brittleness, shape, and configuration, allowing the user to tune the chemistry to rapidly affix variable solid materials to rigid tooling, satisfy their manufacturing demands, quickly and safely remove them, and to do this without significant burdens of time or cost.

BACKGROUND OF THE INVENTION

Electronic devices face continued pressure to design and produce their configurations in a further state of miniaturization, ergonomically pleasing shapes, and a reduced weight. To achieve these goals, many choices in materials of construction and shape must be exercised during upstream manufacturing. Whenever changes occur in the product, invariably there are also changes in tooling. Retooling a fabrication facility requires significant time and cost for requalification. For electronic manufacturing, the substrate must be held uniformly in place during several process steps, including lithography and deposition. Thin solid materials are typically held in place by affixing to a rigid carrier. Carrier substrates may be composed of sapphire, quartz, certain glasses, or silicon, exist in thicknesses from 0.5-1.5 mm (500-1,500 um), and be of larger area than the work unit. Challenges exist in choosing a means of adhesion that offers sufficient adhesive force and quality to withstand the manufacturing process that may include aggressive grinding, polishing, or other mechanical practices, while allowing work units of varying size and shape to be easily removed without damaging their integrity.

Several work unit sizes and shapes are being considered for use in manufacturing. Semiconductor wafers may range in diameters from less than two inches (2"=50 mm) to twelve inches (12"=300 mm), with 12" being the current size used in most high volume manufacturing processes. Within this electronics sector, research is underway with next generation substrates at eighteen inches in diameter (18"=450 mm). Desired thickness of these substrates vary, but most intend to achieve 0.1 mm (100 um) with many in high volume manufacturing to below 0.05 mm (50 um). Handling semiconductor substrates down to these thicknesses is a significant challenge for a manufacturing process which uses conventional tooling.

In the display market, conventional glass substrates are being reduced in thickness to 0.1 mm (100 um) or less. In some cases, alternatives to glass are being considered, including non-glass inorganic and organic materials that exhibit intrinsic properties to support the application of layered metal and dielectric patterns onto its surface to a sufficient level necessary to produce an electronic device. In some cases, the work unit not only supports the laminated electronic layers but also offers sufficient tensile strength and ductility and/or elasticity to allow bending of the substrate in configurations necessary to classify it as a flexible display. These work units may vary in thickness to as high as 100 um or to below 10 um. Whether the material is glass or ceramic, metal, organic, or a composite, they require certain care in the handling, affixing, and removal from carrier substrates. It is well known that as material type, thickness, and shape varies, the method and means to handle such units will also vary. For example, the handling of a 12" diameter round piece of domestic type aluminum metal foil (e.g. thickness 2 mil, ~50 um), although it will wrinkle, is easier to handle than the same size and thickness of silicon, which is prone to cracking and breaking and is unable to support its own weight. As the need for adjusting the tooling and support required to handle work units of various shapes, sizes, and thicknesses, so also exists the demand for adhesives that can be tuned to the needs of the process.

Common tape adhesives do not adequately support work units with the necessary rigidity and uniformity to meet electronic processing objectives and thin substrates to below 0.05 mm. The tape adhesive is much too elastic for mechanical stability during certain manufacturing steps such as polishing or grinding. Additionally, the composition of many tapes are based upon acrylic or silicone chemistry and are observed to exhibit outgassing (weight loss) due to material degradation at elevated temperatures at or above 250 C. The characteristic of outgassing will cause gas bubbles in-between the work unit and carrier substrate which in the case of very thin conditions, may cause deformation to the surface of the thinned work unit, and in severe instances, will perforate the surface to cause catastrophic damage to sensitive circuitry deposited upon the surface. For both mechanical and thermal resistance, there is a need for a system that can be inserted between two hard substrates and achieve the necessary thermal and chemical resistance requirements of the customer process. In this case, a thermal resistance that reaches 250 C or more is necessary. To this end, it is desired to have a porous adhesive which offers sufficient thermal and chemical resistance to support electronic manufacturing processes for semiconductor and display operations and is easy to remove by allowing liquid penetration by capillary action, effect on reducing adhesion of the work unit and carrier substrate, and their subsequent release and separation without harm to the work unit.

SUMMARY OF THE INVENTION

This invention describes a mixture of binder and filler chemistry whereby it is prepared in a manner such that it forms an adhesive porous composite, and upon its insertion and curing between a work unit and a rigid carrier substrate, the composite acts as a temporary adhesive with tunable (adjustable) porosity sufficient to support a series of process steps in manufacturing and subsequently allows liquid capillary penetration within the material which degrades adhesion and releases the work unit by separating the substrates without harm.

The porosity of the adhesive is defined by the ratio of filler and binder in the respective chemistry. With respect to our invention, the filler types under consideration are micro size or larger. Our filler to binder comparison is defined as filler (X) and binder (Z), and the ratio of filler to binder is X/Z. High filler to binder ratios as measured by weight are best to promote porosity in the temporary adhesive. Low filler content is considered to be a closed systems, e.g. non liquid penetrating, and operate similar to pure binder. The measurement of liquid capillary penetration in the adhesive uses methods practiced similarly by those familiar with the art. The temporary adhesive is defined by the easy and rapid liquid capillary penetration to effect a rapid release of the bonded substrates as measured by time of debonding. It is preferable for the filler to binder ratio as a weight measure to be tuned to a value greater than the mathematical value of 0.4 (X/Z>0.4). More preferably, the filler to binder ratio sufficient for rapid release of substrates shall be tuned to >1.0, and most preferably >2.0 as a weight measure of filler and binder.

The chemistry of the temporary adhesive is comprised of resins from one or more polymer families, including but not limited to, epoxies, acrylates, silicones, urethanes, and rubbers, and engineering polymers. These resins may exist as thermoplastic or thermoset materials. Those who are familiar with the art recognize these materials exhibit different organic functionality and as such, are known to interact accordingly to the chemistry of the filler and the same to certain substrates.

Although most, if not all, applications for coatings and interfacial bonding and affixing practices are designed for permanence. The objective of this invention is for temporary applications. Adhesion of work units to carrier substrates is known in many manufacturing practices. The removal aspect of these processes can pose serious challenges. In overcoming these barriers, existing practice involves the use of heat, simultaneous heat and shear stress, laser ablation of the interface to destroy bonding, or chemical diffusion to dissolve the adhesive. These and combinations of such practices prove a great hardship, complexity, and huge cost, for handling complex work units.

There is a need for a temporary adhesive with tunable porosity that affixes the work unit and satisfies the manufacturing demand subjected to it, and then enables rapid removal by capillary penetration of liquids to affect the loss of adhesion land release of the substrates without damage to the integrity of the thin solid material. This invention provides diversity in its form to apply to a wide range of substrates and manufacturing practices such that the temporary nature and benefit of its development can be customized for many objectives.

BRIEF DESCRIPTION OF THE DRAWINGS

In the case of bonding a work unit to a hard carrier, a temporary adhesive is applied between the surfaces with a tunable porosity to effect easy and rapid release of the said substrates. The properties and porosity of the temporary adhesive are defined by the adhesive chemistry. When configuring the adhesive in a manner that represents a temporary bond for work units and carrier substrates, it shall be inserted between such substrates to enable complete affixing to a degree sufficient to support the mechanical effects of the process. In FIG. 1 we diagram an adhesive model, where the work unit 1 is affixed to a carrier substrate 2 using an adhesive with tunable porosity 3 inserted within the bonding interface 4 of the respective substrates. In FIG. 2 we diagram an adhesive model with detail of the components, where a cut-away of the work unit 1 and carrier substrate 2 is done to show detail of the bonding interface 4 where the adhesive with tunable porosity 3 is comprised of bonding adhesive 5 and porous aspect 6.

DETAILED DESCRIPTION

Figure 1:
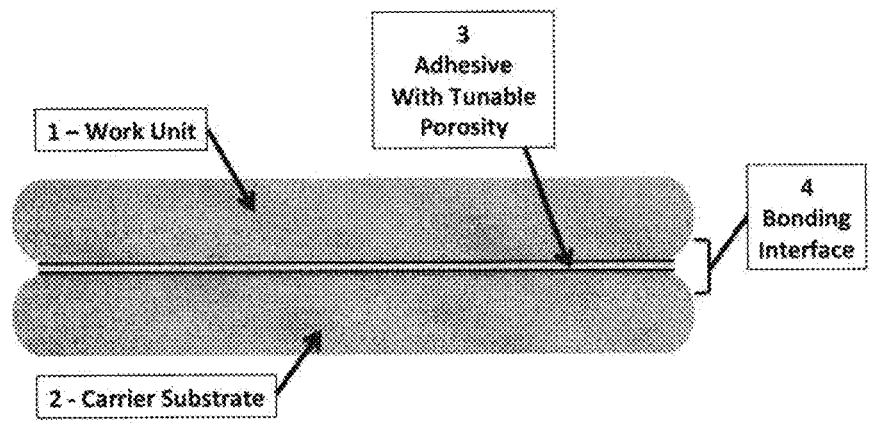
In FIGS. 1 & 2, we define the components of the adhesive with respect to the substrates.
Figure 2:
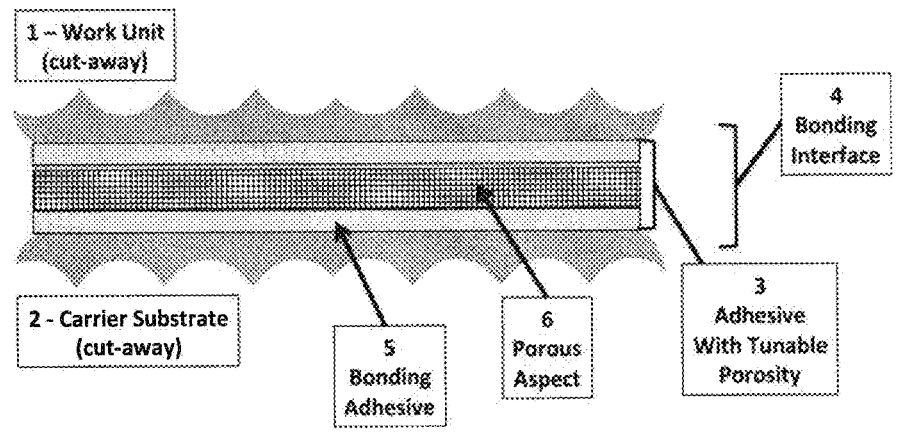

In observing FIGS. 1 & 2, a work unit 1 is affixed onto a carrier substrate 2 with an adhesive with tunable porosity 3 whereby its chemistry is chosen to provide sufficient properties to support a manufacturing process, and upon completion, the work unit is removed liquid capillary penetration to reduce adhesive force and release the substrates. To effect easy and rapid substrate separation, an ideal porosity in the adhesive is defined as the weight ratio of filler to binder as a mathematical number, preferred to be greater than 0.4, and more preferred to be >1.0, or most preferred as >2.0.

This invention describes a chemical mixture that comprises a binder and filler, the result is a reactive resin system to produce a porous adhesive. The application of such an adhesive to solid substrates may be cured in a variety of ways depending upon the resin choice, to produce a final condition whereby it is used to affix two given surfaces. During its formation, the resin system may be cured to a sufficient level to satisfy the design criteria of an adhesive to be used with the specific configuration of the work unit and carrier substrate. It is well known that a given adhesion condition will be dependent upon several factors, including the substrate composition, cleanliness of the substrate surface, texture and/or porosity of the surface, and history of thermal exposure of the adhesive and/or the adhered substrates. Additionally, the measured value of adhesion by tensile or shear testing must be tuned to the manufacturing demands, including high speed grinding that commonly operates with shear forces near 60 psi (pounds per square inch). For example, a 12" wafer operating in such a grinding condition would require an adhesive bonding force sufficient to maintain affixing when exposed to nearly 7,000 lbs of shear force (calculated). Given the variable conditions of the substrate and required shear force criteria are well understood, they can been controlled and maintained such that porosity in the specimen adhesive may be tuned without loss of adhesive force. Using this understanding, there can be adjustments in binder and filler ratio in a manner to govern porosity and substrate release without a loss to adhesive shear force. In other words, through the selection and adjustment of binder and fillers, the adhesive force that affixes a work unit to a carrier substrate may be maintained to satisfy the requirements of a manufacturing process, yet allow rapid release of the substrates by liquid capillary penetration without harm or change to their form.

A variety of thin work units may be used with this invention to include inorganic and organic materials. Inorganic materials include metal and ceramic solids of varying sizes, shapes, and thicknesses. Metal solid work units include copper (Cu), nickel (Ni), iron (Fe), cobalt (Co), titanium (Ti), tantalum (Ta), tungsten (W), molybdenum (Mo), chromium (Cr), aluminum (Al), gold (Au), silver (Ag), neodymium (Ne), palladium (Pd), platinum (Pt), osmium (Os), iridinium (Ir), rhodium (Rh), ruthenium (Ru), nitrides thereof, such as titanium nitride (TiN), and alloys thereof, such as nickel iron (NiFe). Metal work units may exist initially as solids or may be vacuum deposited directly onto the temporary adhesive such that a thin solid form of the metal is completed to a level that its integrity is of a minimum requirement sufficient to proceed with manufacturing and may be removed later by liquid capillary penetration action to effect release. The minimum integrity of the solid metal work unit material may be defined by several properties, to include a tensile strength that is sufficient to support itself.

Solid work units may also exist as crystalline and amorphous ceramic materials including silicon, gallium arsenide, quartz, glass, and alloying mixtures thereof. These ceramic and glass materials may exist initially as solids of varying sizes, shapes, and thicknesses, to include foils or films. Such work units may be vacuum deposited directly onto the temporary adhesive such that a thin solid form of the work unit is completed to a level that its integrity is of a minimum requirement sufficient to proceed with manufacturing and may be removed later by liquid capillary penetration action to effect release. The minimum integrity of the solid work unit material may be defined by several properties, to include a tensile strength that is sufficient to support itself.

Organic films which represent temporary adhered work units include polyimides such as Kapton® (registered trade mark of E.I. du Pont de Nemours and Company), polyarylether such as Arylite® (registered trade mark of Ferrania), polyesters such as Mylar® (registered trade mark of DuPont Teijin Films), polypropylene, polyethylene, polysulfone (polysulfone, polyethersulfone, polyphenylsulfone) such as Radel® (registered trade mark of Solvay Solexis), polybenzimidazole, polyphenylene sulfide such as Torelina® (registered trade mark of Toray Film Products, Co., Ltd.), polycarbonate, polystyrene, polyacrylic, fluoropolymers as fluoroethylene propylene (FEP), perfluoroalkoxy polymer (PFA), ethyltetrafluoroethylene (ETFE), and ethylene-chlorotrifluoroethylene (ECTE) such as Halar® (registered trade mark of Solvay Solexis), polyvinylidene fluoride (PVDF) such as Kynar® (registered trade mark of Solvay Solexis), polyether ether ketone (PEEK), polyether imide (PEI), polybutylene terephthalate (PBT), polyethylene naphthalate (PEN), and various polyamides classified as nylon. Thin solid organic polymers may exist initially as solids of varying sizes, shapes, and thicknesses, to include foils or films, may be cast from liquid solutions, or may be vacuum deposited, some of which may be applied directly onto the temporary adhesive such that a thin solid form of the work unit is completed to a level that its integrity is of a minimum requirement sufficient to proceed with manufacturing and may be removed later by liquid capillary penetration action to effect release. The minimum integrity of the solid work unit material may be defined by several properties, to include a tensile strength that is sufficient to support itself.

The chemistry of the adhesive comprises polymeric resins from at least one specific chemical family and may also be combined with other separate chemical families. The properties of the final form adhesive are controlled by the content adjustment of mixing resins of different molecular weights or functionality within a chemical family or by mixing between different chemical families. For example, one temporary adhesive may comprise one or more resins from the family of epoxy resins (i.e. alkyl epoxy, novolac epoxy, etc.), whereas another temporary adhesive may comprise one or more resins from different chemical families (i.e. epoxy and acrylic, etc.). The variation of these resin choices will produce a direct effect on the properties and porosity of the system in affixing the work unit onto the carrier substrate. Those familiar with the art recognize that in order to effect the reaction of such chemistries, there must also include the necessary initiators. These initiators are considered as cross-linkers, activators, catalysts, or reactors, and represent a small portion of the overall composition. Therefore, it shall be understood that whenever mention is made about the use of a specific chemistry or resin, that chemistry must include the respective initiator, and the choice of the initiator may produce certain subtle differences, the primary emphasis is that an initiator that is matched with the chemistry of choice must be included in the system.

The chemistry of the temporary adhesive may comprise a variety of base resins. The reactive resins include, but are not limited to, those undergoing cross-linking polymerization mechanisms, including epoxies, acrylates and silicones. These systems undergo thermal, chemical, and photo-initiated polymerization by condensation and addition mechanisms as described in the literature, and described as thermosets. Thermoset chemistries offer rigidity and resistance to the process conditions. Non cross-linking resins include those described as amorphous or thermoplastics. The thermoplastic resins may add strength and durability to the adhesive. Additional properties by amorphous polymers include barrier (gas non-diffusion), temperature resistance, transparency, detergency, and water solubility. The following passages offer more detail on the resins used in the adhesive chemistry. The production of a temporary adhesive for use in this invention is not limited to the resins identified here.

Epoxy resins used for this invention may comprise a single or multiple epoxide functional group, also called oxirane, or ethoxyline, normally identified as a three-membered oxide ring described by the following structures classified as (1) glycidyl ethers, (2) glycidyl esters, (3) gylcidyl amines, (4) linear aliphatics, and (5) cycloaliphatics:

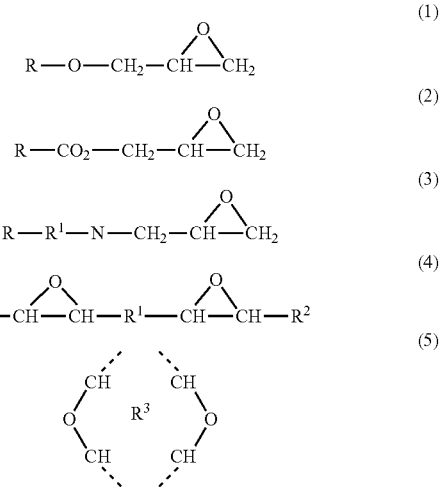

where both R, $R^1$, and $R^2$ may represent the following: hydrogen (—H), amide (—$NH_2$), methyl (—$CH_3$), hydroxyl (—OH), alcohol (—$CH_2OH$), or any one of the groups represented by the formula —$C_nH_{(2n)}$, —$C_nH_{(2n+1)}$, or —$C_nH_{(2n)}OH$ where n varies from 2-20; cyclic and aromatic hydrocarbon functional groups of the formula —$C_6X_5$, where X may be substituent groups such as hydrogen (—H), the halogens (—F, —Br, —Cl, —I), hydroxyl (—OH), and —COOH groups, $R^3$ represents a cyclic or aromatic structure of the formula —$C_6X_5$, where X may be substituent groups such as hydrogen (—H), the halogens (—F, —Br, —Cl, —I), hydroxyl (—OH), and —COOH groups, all of these variations may exist in multiple substituent formats, or monomers, as given in the example structure (6):

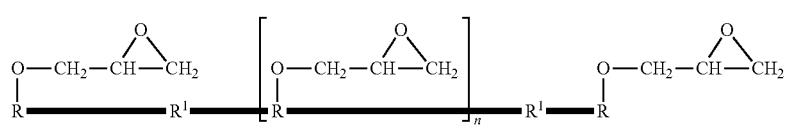

(6)

wherein structure (6) describes a polymer comprising monomers of glycidyl ether with substituent R and linked by $R^1$. Such resins may include: CARDOLITE 514 (difunctional glycidyl ether epoxy resin) produced by Cardolite Corporation, ADEKA EP 4088S (epoxy resin and urethane resin curing agent) produced by Adeka Corporation, EBECRYL3605 (partially acrylated bisphenol-A epoxy) produced by Cytec Industries, Inc.

In one embodiment, the epoxy resin includes that of structure (6), wherein the monomeric epoxide substituent is of the novolac variety, also referred to as epoxidized novolac resin, where R represents an aromatic ring of the form $C_6X_5$, where X may be substituent groups such as hydrogen (—H), the halogens (—F, —Br, —Cl, —I), hydroxyl (—OH), and —COOH groups, and the linkage $R^1$ is best represented by substituents of the formula —$C_nH_{(2n)}$. Such epoxy novolac resins include 3-6 epoxide groups per molecule (n=1.6) of the general formula exhibited by the structure (6). General commercialized products which meet this criteria include: DEN 431 and DEN 439 produced by The DOW Chemical Company; EPON 154, EPON 160 and EPON 161 produced by Resolution Performance Products (Hexion), REZICURE 3056 produced by SI Group.

Acrylic monomers and polymers used in this invention include acrylate esters by the general formula described in item (7), where both $R_1$ and $R_2$ may represent the following: hydrogen (—H), amide (—$NH_2$), methyl (—$CH_3$), hydroxyl (—OH), alcohol (—$CH_2OH$), or any one of the groups represented by the formula —$C_nH_{(2n+1)}$ or —$C_nH_{(2n)}OH$ where n varies from 2-20; aromatic hydrocarbon functional groups of the formula —$C_6X_5$, where X may be substituent groups such as hydrogen (—H), the halogens (—F, —Br, —Cl, —I), hydroxyl (—OH), —COOH; and —$COOR_3$ groups, wherein $R_3$ represents the following: hydrogen (—H), amide (—$NH_2$), methyl (—$CH_3$), hydroxyl (—OH), alcohol (—$CH_2OH$), or any one of the groups represented by the formula —$C_nH_{(2n+1)}$ or —$C_nH_{(2n)}OH$ where n varies from 2-20.

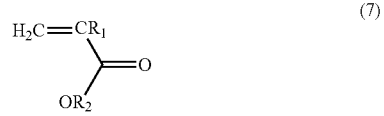

(7)

It is to be understood that where substituent groups are present, they should be present in a manner such that they do not unduly hinder or interfere with the thermal or photo initiated cure of the acrylic monomer. The preferred acrylic monomers are those represented by item (7), wherein $R_1$ is a hydrogen (—H), or methyl (—$CH_3$), defining the molecule as an acrylate or methacrylate, respectively, and $R_2$ to represent a substituent of the form or —$C_nH_{(2n)}OH$ where n varies from 2-20. Such preferred acrylics include hydroxyethyl acrylate (CAS #818-61-1), hydroxypropyl acrylate (CAS #25584-83-2), hydroxyethyl methacrylate (CAS #868-77-9), and hydroxy propyl methacrylate (CAS #27813-02-1). The more preferred acrylic monomers are those represented by item (7), wherein $R_1$ is a hydrogen (—H), or methyl (—$CH_3$), and $R_2$ to represent a substituent of the form amide (—$NH_2$), defining the molecule as an acrylamide. Such preferred acrylics include n,n-dimethylacrylamide (DMAA, CAS #2680-03-7). DMAA has been shown to exhibit high compatibility and solubility for other resins and a significantly faster curing time over the conventional acrylates or methacrylates.

Polysiloxane resins suitable for use herein exist in commerce by multiple suppliers, exhibiting broad classification differences in silicone subcategories, types, and polarities, and reacting through different mechanisms, including addition and condensation polymerization. The use of such materials in the preparation of the adhesive shall consider compatibility and reactivity between the polysiloxanes as a key factor in determining their final behavior. For example, species of similar polarity may be compatible yet be inconsistent in their preferred reaction mechanisms. These include organofunctional polysiloxanes and silicone resin intermediates, both are expected to undergo thermal initiated condensation reactions following hydrolysis. However, vinyl silicones (rubbers) are largely a phobic chemistry and undergo addition reactions with metal catalysts. Therefore, we will differentiate these chemistries accordingly, as their use in an adhesive is expected to follow the same considerations of compatibility and reactivity.

The preferred polysiloxanes include oxysilanes of the formulas represented as $(R_1)$—$[(R_2)(R_3)SiO]_n$—$R_4$ or $(R_5)$O—$[(R_3)_2SiO]_m$—$R_5$, where $R_1$, $R_2$, and $R_3$, may exist as a hydrogen or carbon containing functional group of the variety as alkyl, phenyl, cycloalkyl, alkoxy, hydroxyalkyl, alkoxyalkyl, and hydroxyalkyalkoxy, where these groups may contain up to 6 carbons, and $R_4$ comprises hydrogen, alkyl, or phenyl, where a minimum of 2 of the groups are oxy substituents used for polymerization, and $R_5$ is similar to $R_4$, however, there may exist up to 12 carbons, and n and m varies from 1-5 or to a sufficient number to reach a molecular weight of 500,000.

Siloxane resins suitable for use herein include a broad range of alkyl, aryl, oxygenated, and cyclic substitutions. In the case where thermal resistance is critical, the substitution will be methyl and phenyl. The moieties on the siloxane can also exhibit specific organic functional groups which are well known to interact with the chemistry of the substrate interface. For example, in the case of a mercaptan siloxane moiety, the sulfur group interacts with certain inorganic solid surfaces, such as metals, to increase the interfacial adhesion force. Most importantly, moieties which exhibit epoxy, acrylic, or amine character, are known to interact with a corresponding chemistry within an organic matrix and at the interface of polymeric solid surfaces, resulting in molecular entanglement and van der Waals interactions as hydrogen and covalent bonding, and ultimately, an increase of adhesion.

Silicone resins based on cyclic siloxane molecules are preferred. Useful cyclic silicones are hydroxy functional cyclic silicones classified as liquid resins, flake resins, and silicone intermediates as provided by suppliers Dow Corning and Wacker Silicones (Wacker-Chemie GmbH). Preferred cyclic siloxane choices for adhesive development, include those with high compatibility with other polymers, dissolution in a wide range of solvents, and those classified as silanols. These silanol compounds exhibit relatively high capacity for condensation reactivity and include those with two or more hydroxyl groups per cyclic silicone molecular unit and a phenyl/methyl ratio ranging from 50-120% and a molecular weight ranging from 4,000 to 300,000. In all cases, the relative content of silicon dioxide is high, usually greater than 50%.

The choice of initiator is dependent upon the polymer and the application. Epoxy based systems use organic amine and acid materials to open the oxirane ring and initiate cross-linking. These may be promoted by thermal or photo means. Free-radical initiators are used with acrylics, also promoted by applications that apply heat or ultraviolet exposure. Silicone vinyl compounds require metal catalysts to initiate free-radical generation. These classes of initiators and the required media to support polymerization and enable applications of the adhesive to facilitate fixation of the two surfaces. In one embodiment, an epoxy resin system is used with an initiator which is of the polyamine form and of higher molecular weight. Higher molecular weight amine chemistries will remain in the system for longer durations and provide an environment, which efficiently cross-links the epoxy resin. Amines may include triethylenetetramine (TETA), N-methylethanolamine (NMEA), and N-methyldiethanolamine (DMEA) produced by The DOW Chemical Company, and meta-xylenediamine (MXDA) as produced by Mitsubishi Chemical Company. Desirable amine amounts are typically present at levels from about 1% to about 5%, by weight as compared that of the epoxy. A similar approach for epoxies may also be used with acidic materials. The acids tend to have higher reaction rates with epoxies over that of amines. Preferred acids are various sulfonic acids such as toluene, dodecylbenzene, and methane sulfonic acids. The epoxy begins to react upon contact, so the means of mixing and application must be considered. Where acidic reactions are preferred for epoxies are in the case of photo acid generators (PAGs). These systems comprise sulfonium salts which release varying molecular weights of toluene sulfonic acid to cause immediate reaction. This rapid reaction is used in many photoresists. One common photoacid generator is triphenylsulfonium trifluoromethane sulfonate (TPST). Typical amounts of a PAG is in the range of <2% by weight of epoxy.

Initiators for acrylic monomers include thermal (thermal radical initiator, TRI) or photo activated free radical initiators. It is well known from the literature that these free-radical initiated systems will combine with the vinyl group of the acrylic, initiate a chain reaction, whereby the product acrylate free radical combines with other vinyl groups of adjacent acrylics and produce final crosslinked product. These TRI materials include inorganic persulfates such as ammonium persulfate (APS), potassium persulfate, and sodium persulfate, and organic persulfates such as quaternary ammonium persulfates (e.g. tridodecyl ammonium persulfate); peroxides include benzoyl peroxide (BPO), methyl ethyl ketone peroxide, dicumyl peroxide, and benzopinacole (BK), cumene dihydrogen peroxide, and those organic peroxides under the tradename Luperox™, azo-compounds including 2,2'-azobisisobutyrnitrile (AIBN), 4,4-azobis(4-cyanovaleric acid), 1,1'-azobis(cyclohexanecarbonitrile), acetates as peracetic acid, and tert-butyl peracetate. Benzoin photoinitiators are common for use as initiators for acrylic chemistry. One type of benzoin photosensitizer is 2-phenylacetophenone, which undergoes photoscission to release radicals of benzoyl, and benzyl, which become the primary chain polymerization initiators in the curing process. Photochemically generated free radicals react directly with the double bond of the vinyl monomer as a chain-initiating step. The invention involves a cure process between a photoinitiator that is present in the liquid polymer system and actinic radiation from an ultraviolet emission source. Common photoinitiators include benzoin ethers, acetophenones, benzoyl oximes, and acylphosphines. These initiators may include phenylglyoxylate, benzyldimethyl-ketal, ∝aminoketone, ∝hydroxyketone, monoacyl phosphine (MAPO), bisacylphosphine (BAPO), metallocene, and iodonium salt. Preferred initiators include 2-hydroxy-2-methyl-1-phenyl-1-propanone (CAS #7473-98-5) and phosphine oxide phenylbis(2,4,6-trimethylbenzoyl)-(CAS #162881-26-7). A trade name product, which represents these materials, includes Irgacure 2022, as manufactured by CIBA Specialty Chemicals, Basel, Switzerland. The product exhibits absorption maxima at 365 nm, 285 nm, and 240 nm. Concentrations are used anywhere at ≤5% by weight.

Adhesive mixtures which are chosen to use silicone resins may contain anywhere from 20-100% solids of silicone polymers having polysiloxane-vinyl and silyl-hydride character. In the presence of a metal catalyst, the vinyl compounds initiate free radicals which undergo addition polymerization with the silyl-hydride to produce a polymerized final product. To control the reaction rate for application and bonding, there are chelates binding the platinum. During heat exposure, the chelate degrades to release platinum and then triggers polymerization. In the case of silanol polysiloxanes, these monomers will crosslink upon heat exposure, usually in the range 200-250 C.

Additives may also be present to facilitate the desired tunable properties. For example, the use of fluoropolymers are known for surface sensitive activity. The addition of fluoropolymer surfactants meet this objective. Other common surfactants as nonionics or charged species as cationic or anionic may provide surface sensitive adjustments in adhesion and also allowing fluctuations in melt point to give an amorphous character to improve adhesion.

In addition to the binder constituents as resins, initiators, and additives, the chemistry of the temporary adhesive also contains fillers. Fillers are specifically exemplified by fibrous and particulate forms. Recommended fillers to facilitate porosity include those of dimensional size in microns. Micron sized fibers include glass fiber, asbestos, alumina fiber, ceramic fiber composed of both alumina and silica, boron fiber, zirconia fiber, silicon carbide fiber, metal fibers, polyester fibers, aramid fiber, nylon fibers, phenolic fibers, natural plant and animal fibers. Preferred glass fibers are available as milled glass fibers to reduce their length and achieve improved coating conditions to produce a consistent adhesive composite. Products in this area include Microglass 9110 and Microglass 3082, available from Fibertec Co., Inc.

Fillers as micron size particulates include granular or particulate fillers such as fused silica, precipitated silica, fumed silica, calcined silica, zinc oxide, calcined clay, carbon black, glass beads, alumina, talc, calcium carbonate, clay, aluminum hydroxide, barium sulfate, titanium dioxide, aluminum nitride, silicon carbide, magnesium oxide, beryllium oxide, kaolin, mica, zirconia, and so forth. Preferred glass particles include those produced by Potters Industries Inc., including solid and hollow spheres ranging in size from diameters as low as 5 um up to 200 um. Mixtures of two or more of the preceding as fibers and particles.

Filler materials also include woven and non-woven fiberglass, polyester, and carbon fiber products. These materials are produced by several manufacturers. It should be understood that filler products not mentioned here are considered to be included for consideration in this application and invention. Methods to compare matted or veil products may be based upon the weight of the specimen or its thickness. For example, E-CR Glass nonwoven grade #8000130 manufactured by Hollingsworth & Vose, indicate a base weight of 0.30 oz/yd$^2$ (10.2 g/m$^2$) and a thickness of 3.0 mils (0.08 mm). A similar "C" glass material at 30 g/m$^2$ and thickness of 0.31 mm is provided by Owens Corning Veil U.K. Limited.

Filler materials also include glass filters (glass papers), commonly used for filtration practices. The paper-like media is available in pre-cut pieces as rounds or on rolls. The products are described using several criteria, including base weight (g/m2) and thickness in mm. For example, a binderless (no organic binding agent) glass filter paper having grade number B-85 as available from I. W. Tremont Co., Inc., includes a 78.3 g/m$^2$ base weight and thickness of 0.46 mm. Additional and similar filtration-based fillers include glass and ceramic frit (fused silica).

One final area of fillers include metals as screen and filtration products. The metal woven and non-woven materials may be composed of many materials and alloys. These materials are governed by similar character as the glass products, but due to their metal form, they are less inert as compared to glass. Metals may not be easily used for certain acidic compounds due to their reactivity. The metal forms can be rigid to offer unique additional mechanical stability as a filler. Metal screens may be laminated together to offer unique porosity.

There exist several mechanisms for curing, B-staging, reacting, and alike for inserting and affixing the adhesive between a work unit and the carrier substrate. As a fundamental characteristic of any adhesive, there must be sufficient wetting between both surfaces. Wetting is defined as the interaction of a lower contact angle (low energy) liquid or semi-solid onto a higher contact angle (higher energy) substrate. In many cases, the difference in surface energy between the adhesive composite film and substrate surface can be as low as 10 dynes/cm, however, the difference is preferably much larger. In optimum conditions, a lower energy adhesive composite film will easily spread over the higher energy surface of the substrate and achieve good wetting.

Although wetting is fundamental to the adhesion process, the performance of the adhesive as a bonding system with rapid release by liquid capillary penetration is dependent upon the choice of binder and filler chemistry and the interaction of its chemical functionality with the substrate. Assuming we keep the adhesive chemistry constant, the interaction is then dependent upon the application, cure, and affixing steps. The adhesive composite chemistry may comprise organic resins as the binder in pure form (i.e. 100% solids) or dissolved into carrier solvents, mixed with the filler. Cure programs may involve a soft bake step to affix the adhesive to the carrier substrate, followed by a hard bake whereby the work unit is held in direct contract with the B-stage adhesive composite affixed to the carrier substrate. The mechanism by which the adhesive is applied, cured, and the work unit is brought into its contact includes a plurality of approaches which this invention is not limited. Choices on these approaches are based upon many considerations, including the handling of the work unit, cure mechanism, and that method which minimizes the existence of trapped air and completely fills any voids. Regardless of the approach, the final objective is to achieve a bonded form where the work unit is affixed to the carrier substrate, which allows the manufacturing process to proceed.

Once the manufacturing process is complete, release of the work unit is performed by liquid capillary penetration into the porosity of the adhesive of a given tuned value. The speed of substrate release is dependent upon the tuned porosity of the adhesive and the manner and conditions which it is subsequently exposed to the given liquid to effect capillary penetration. Where necessary, the release proceeds by submersing the bonded unit in a given liquid chemistry which corresponds to the same hydrophilic or hydrophobic nature of the adhesive. Once submerged, certain agitation mechanisms may be practiced that are normal or in the direction of the interfacial bond area between the two substrates. The liquid chemistry penetrates the area and travels by capillary action throughout the porous zone of the adhesive. The speed of the liquid penetration is controlled by porosity of the adhesive, which depends upon the filler to binder ratio of its chemistry. To effect easy and rapid substrate separation, an ideal porosity in the adhesive is defined as the weight ratio of filler to binder as a mathematical number, preferred to be greater than 0.4, and more preferred to be >1.0, or most preferred as >2.0.

Applications of handling and supporting a wide range of sizes, shapes, and thicknesses of work units are becoming a common challenge in the manufacturing of electronic devices. Due to the reduced cost structures continually promoted, the manufacture of virtually any electronic device is most competitive when it is conducted in Asia. Because cost pressures exist and manufacturing must be conducted in Asia, there must be many options and their design simple for handling different work units in electronics. For example, semiconductor wafer substrates are round, extend to 12" in diameter, and are robot transferred from tool to cassette. Conversely, display panels are square or rectangular, can extend to more than 60" on a side, and are conveyorized. In consideration of thin solid materials for each market, substrate thickness may vary from as low as 10-100 um (microns). By offering the flexibility to tune or adjust the properties and porosity of the temporary adhesive in affixing work units to carriers, there is generated a broad range of options in manufacturing. These options reduce the need of new tooling and additional manufacturing steps. Through these practices and others not mentioned here, the invention's novelty and uniqueness is realized.

EXAMPLES

The compositions of the invention and the method of demonstrating the examples are described. It is understood, however, that the invention is not meant to be limited to the details described therein. In the examples, the percentages provided are percent (%) by weight unless otherwise stated. The invention is further illustrated, without limitation, by the following examples. The measurement of performance and selectivity of the invention is conducted using practices readily accepted by the industry.

Coatings are produced on a Brewer Science, Inc. CB-100 spin-coater, while spray and encapsulation uses custom tooling designed at Daetec. Metrology data is generated by a XP-1 stylus profiler, AFP-200 atomic force profiler, and a Xi-100 optical profiler, using equipment settings 5 mg stylus load, minimum 4 mm distance, and a speed of 0.5 mm/sec. Modified thermogravimetric test methodology for outgas is conducted by typical laboratory scales (+/−0.1 mg). UV cure equipment includes the Intelli-Ray 400 microprocessor controlled light curing system. Furnace support uses box type # ST-1200C-121216 with microprocessor programming, nitrogen purge, and dispersion fan for chamber uniformity. Force gage M5-series with 90 degree sled and stand ESM301, fixtures, and software.

Silicon wafers and glass plates (~0.5 mm thick) are used as the inorganic substrate (carrier substrate) upon which the adhesive is developed, cured, and subsequent affixing of a work unit is tested. This material forms the basis for the survey, which the invention is demonstrated. Multiple polymers are tested and described for each example.

Example #1

The following experiments demonstrate the relationship of liquid penetration by capillary activity through an adhesive matrix prepared with a specific amount of binder and filler. Experiment #1 indicates the trend of faster penetration and release as thickness is reduced. Experiment #2 suggests improved penetration and release as the filler:binder ratio is increased. For both experiments, the polymer binder is a thermoplastic polyurethane (TPU), identified as Estane 5715 TPU, exhibiting a glass transition (Tg) and softening point of 23 C and 55 C, respectively, produced by Lubrizol Advanced Materials, Inc. The chosen filler for these experiments is a milled glass fiber identified as Microglass 3082, which includes fiber diameters and length of 16 um and 120 um, respectively, as manufactured by Fibertec. Appearance of the milled glass is a powder. The TPU is dissolved into n,n-dimethylacetamide (DMAC) at approximately 25% solids concentration. To several solutions, filler is added to a level of achieving filler:binder ratios between 0.4 and 2.5, measured by wt of each constituent on a polymer binder basis. The mixtures are then applied to glass plates, cured to evaporate solvent using a bake temperature and time of 150 C for 2 min. Once cured, the glass plate with adhesive is bonded with another corresponding glass plate to produce a bonded pair. The bonded pairs are used for the following experiments to measure release in a solvent system of a proprietary anhydrous solvent mix containing an alkali in dimethylsulfoxide (DMSO), the solution is named AA7:DMSO.

A series of bonded glass pairs are prepared with a binder:filler ratio measured as 1.0, however, the thickness of each adhesive composite varies from 0.33 to 0.95 mm. The time to achieve full penetration and release of the bonded glass pair in AA7:DMSO is measured and reported in Table 1.

TABLE 1

Penetration and release in AA7:DMSO of the bonded pair adhesive prepared as binder Ethane 5715 TPU with filler Microglass 3082, exhibiting a filler:binder ratio of 1.0. Thickness are varied as stated.

| # | Filler:Binder ratio | Thickness (mm) | Penetration & release time (sec) |
|---|---|---|---|
| 1 | 1.0 | 0.33 | 30 |
| 2 | 1.0 | 0.50 | 300 |
| 3 | 1.0 | 0.95 | 600 |

Example #2

A series of bonded glass pairs are prepared with a binder:filler ratio measured over a range between 0.4 and >2.0. Thickness of each adhesive composite is maintained constant at approximately 1.0 mm. The time to achieve full penetration and release of the bonded glass pair in AA7:DMSO is measured and reported in Table 2.

TABLE 2

Penetration and release in AA7:DMSO of the bonded pair adhesive composite film prepared as binder Ethane 5715 TPU with filler Microglass 3082, exhibiting a filler:binder ratio of 1.0. Thickness are varied as stated.

| # | Thickness (mm) | Filler:Binder ratio | Penetration & release time (sec) |
|---|---|---|---|
| 1 | 1.0 | 0.4 | 900 |
| 2 | 1.0 | 1.0 | 300 |
| 3 | 1.0 | 2.4 | 30 |

Example #3

This example demonstrates the use of an ultraviolet (UV) curable adhesive system with a filler based upon the use of glass filter paper and non-woven fiberglass. Results are consistent for preferred results with a thin adhesive composite film and increased filler:binder ratio. The substrates are 2"×3" glass plates. The filler materials are cut to shape and to each, there is a specific amount of adhesive binder added to give a filler:binder ratio as a mathematical number stated in the results table. The adhesive is a proprietary adhesive based upon the monomer n,n-dimethylacrylamide (DMAA) with additives to enable the adhesive to be soluble in alkaline detergent. The UV curing is enabled by the addition of 5% Irgacure 2022 as free-radical initiator. Cleaning is conducted at 60-70 C for 15 min by common immersion conditions with no agitation. The results are reported based upon an observed % penetration and delamination, leading to complete release of the bonded glass pair. Results are reported in Table 3.

TABLE 3

Penetration and release in alkaline detergent of pH > 12 of the bonded glass pair adhesive prepared as binder UV cure DMAA-based adhesive with fillers as glass filter paper and nonwoven fiberglass with stated thickness and exhibiting the stated filler:binder ratios.

| # | Filler Type | Thickness (mm) | Filler:Binder Ratio | Penetration & release time (sec) | Extent of Penetration (%) |
|---|---|---|---|---|---|
| 1 | No filler (baseline) | <0.1 | N/A | 900 | 0% |
| 2 | B85 Filter Paper | 0.5 | 3.0 | 900 | 10% |
| 3 | B85 Filter Paper | 0.5 | 1.2 | 900 | 0% |
| 4 | B85 Filter Paper | 0.5 | 0.6 | 900 | 0% |
| 5 | E50 Glass Nonwoven | 0.1 | 1.9 | 900 | 100% |
| 6 | E50 Glass Nonwoven | 0.1 | 0.76 | 900 | 50% |
| 7 | E50 Glass Nonwoven | 0.1 | 0.38 | 900 | 0% |
| 8 | E10 Glass Nonwoven | 0.05 | 0.4 | 900 | 0% |
| 9 | E10 Glass Nonwoven | 0.05 | 0.16 | 900 | 0% |
| 10 | E10 Glass Nonwoven | 0.05 | 0.08 | 900 | 0% |

BRIEF DESCRIPTION OF THE DRAWING

FIG. 1. Diagram of the adhesive model, where the work unit 1 is affixed to a carrier substrate 2 using an adhesive with tunable porosity 3 inserted within the bonding interface 4 of the respective substrates.

FIG. 2. Diagram of the adhesive model with detail of the components, where a cut-away of the work unit 1 and carrier substrate 2 is done to show detail of the bonding interface 4 where the adhesive with tunable porosity 3 is comprised of bonding adhesive 5 and porous aspect 6.

What is claimed is:

1. An attach and release process using a temporary adhesive with tunable porosity to affix a work unit onto a carrier substrate and create an interfacial bond between the work unit and the carrier substrate, whereby subsequent to a manufacturing process, porosity of the temporary adhesive allows penetration of a liquid into the interfacial bond and releases the work unit without harm and without a subsequent cleaning process by:
    adding a filler to a binder to create the temporary adhesive with an increased porosity where the ratio of filler to binder in the temporary adhesive is a ratio >1 on a weight basis;
    applying the temporary adhesive with tunable porosity between the work unit and the carrier substrate to affix the work unit to the carrier substrate;
    completing an electronics manufacturing process involving the work unit affixed to the carrier substrate;
    contacting the work unit affixed to the carrier substrate with a penetrating liquid which preferentially absorbs into the interfacial bond between the work unit and the carrier substrate;
    dissolving the binder contained by the temporary adhesive with tunable porosity and degrading affixing properties between the work unit and the substrate carrier without harming the work unit;
    releasing the work unit from the carrier substrate without damage or a further cleaning process to the work unit;
    wherein the binder comprises one or more polymer(s) from the group consisting of acrylate, silicone, urethane, rubber, and engineering polymer; wherein the filler comprises one or more filler(s) from the group consisting of micro-fiber, micro-glass bead, micro-glass sphere, ceramic, cellulose, woven polyester, non-woven polyester, woven glass, non-woven glass, glass frit, ceramic frit, metal woven screen and metal non-woven screen.

2. The attach and release process of claim 1, wherein the ratio of filler to binder in the temporary adhesive is >2 on a weight basis.

3. The attach and release process of claim 1, wherein the ratio of filler to binder in the temporary adhesive is >3 on a weight basis.

4. The attach and release process of claim 1, wherein the binder comprises an engineering polymer.

5. The attach and release process of claim 1, using a temporary adhesive wherein the binder comprises one or more binder(s) from the group consisting of acrylate, silicone, urethane, rubber, and engineering polymer wherein the engineering polymer comprises one or more polymer(s) from the group consisting of polyimide, polyamide, polyamideimide, polybenzimidazole, polybenzoxazole, polysulfone, polyethersulfone, polyphenylsulfone, polyarylether, polyetheretherketone, polyvinyidenedifluoride, cyclic olefin copolymer, polyethylene terephthalate, polybutylene terephthalate, polyacrylonitrile, polyaryletherketone, polyketoneketone, styrene-acrylonitrile, polycarbonate, polystyrene, polyvinylchloride, polyphenylene sulfide, polytrimethylene terephthalate, polyvinylidene chloride, acrylonitrile butadiene styrene, and liquid crystal polymer.

6. The attach and release process of claim 1, wherein the binder further comprises an initiator.

7. The attach and release process of claim 1, wherein the electronics manufacturing process comprises micro electro mechanical systems (MEMS).

8. An attach and release process using a temporary adhesive with tunable porosity to affix a work unit onto and create an interfacial bond between the work unit and the carrier substrate, whereby subsequent to a manufacturing process, porosity of the temporary adhesive allows penetration of a liquid into the interfacial bond and releases the work unit without harm and subsequent cleaning process by:
    adding a filler to a binder to create the temporary adhesive with an increased porosity where the ratio of filler to binder in the temporary adhesive is a ratio >1 on a weight basis;
    applying the temporary adhesive with tunable porosity between the work unit and the carrier substrate to affix the work unit to the carrier substrate;
    completing an electronics manufacturing process involving the work unit affixed to the carrier substrate;

contacting the work unit affixed to the carrier substrate with a penetrating liquid which preferentially absorbs into the interfacial bond between the work unit and the carrier substrate;

dissolving the binder contained by the temporary adhesive with tunable porosity and degrading affixing properties between the work unit and the substrate carrier without harming the work unit;

releasing the work unit from the carrier substrate without damage or a further cleaning process to the work unit;

wherein the filler is micron-sized in length, thickness or diameter and wherein the filler comprises one or more filler(s) from the group consisting of micro-fiber, micro-glass bead, micro-glass sphere, ceramic, cellulose, woven polyester, non-woven polyester, woven glass, non-woven glass, glass frit, ceramic frit, metal woven screen and metal non-woven screen;

and wherein the binder comprises one or more binder(s) from the group consisting of acrylate, silicone, urethane, rubber, and engineering polymer.

\* \* \* \* \*